United States Patent [19]
Lesk et al.

[11] Patent Number: 5,268,326
[45] Date of Patent: Dec. 7, 1993

[54] METHOD OF MAKING DIELECTRIC AND CONDUCTIVE ISOLATED ISLAND

[75] Inventors: Israel A. Lesk, Phoenix; Frank S. d'Aragona, Scottsdale; Francine Y. Robb, Tempe; Raymond C. Wells, Scottsdale, all of Ariz.

[73] Assignee: Motorola, Inc., Schaumburg, Ill.

[21] Appl. No.: 951,991

[22] Filed: Sep. 28, 1992

[51] Int. Cl.$^5$ .......................................... H01L 21/76
[52] U.S. Cl. .................................... 437/62; 437/914; 437/203; 148/DIG. 12; 148/DIG. 135
[58] Field of Search .......................... 437/62, 914, 203; 148/DIG. 12, DIG. 135, DIG. 91

[56] References Cited

U.S. PATENT DOCUMENTS

| | | |
|---|---|---|
| 3,508,980 | 4/1970 | Jackson et al. |
| 4,839,309 | 6/1989 | Easter et al. |
| 5,013,681 | 5/1991 | Godbey et al. |
| 5,091,330 | 2/1992 | Cambou et al. |

FOREIGN PATENT DOCUMENTS 2-257652 10/1990 Japan.

OTHER PUBLICATIONS

Haisma, J., "Silicon on Insulator . . . Evaluations", Jap. J. Appl. Phys., vol. 28, No. 8 (1989) pp. 426–443.

Primary Examiner—George Fourson
Attorney, Agent, or Firm—Miriam Jackson

[57] ABSTRACT

A dielectric and conductive isolated island is fabricated by providing an active wafer having a first and a second major surface, a doped region extending from the first surface, and a trench formed at the first surface. A conductive layer is formed on the first surface and in the trench. A planarizable layer comprised of a dielectric layer is then formed on the conductive layer. A handle wafer is bonded to the planarizable layer. The active wafer and the handle wafer are heated so that the doped region diffuses along the conductive layer to form an equalized concentration of dopant along the conductive layer which diffuses into the active wafer to form the doped region adjacent all of the conductive layer. A portion of the second surface of the active wafer is then removed so that at least a portion of the dielectric layer of the planarizable layer is exposed.

18 Claims, 3 Drawing Sheets

METHOD OF MAKING DIELECTRIC AND CONDUCTIVE ISOLATED ISLAND

BACKGROUND OF THE INVENTION

This invention relates, in general, to dielectric isolation, including, but not limited to a method of forming dielectric isolated islands.

In general, dielectric isolation prevents the interaction between adjacent semiconductor devices formed on a single semiconductor material. Dielectric isolation is provided by forming a dielectric layer surrounding a tub in the semiconductor material. In certain applications, it is desirable to form a conductive layer along with the dielectric layer.

A method of fabricating a dielectrically isolated area including a silicide layer which is selectively doped has been used. This method, described in U.S. Pat. No. 4,839,309 comprises using a selectively doped silicide layer as a diffusion source for various active portions (collector, emitter, drain, or source) of high voltage semiconductor devices. A disadvantage of this process is that several masking steps are required to fabricate the structure. It would be desirable to reduce the number of masking steps in order to reduce the manufacturing cost. In addition, this method teaches making electrical contact to the silicide layer at the surface. This means that the silicide layer must be thick enough to readily make electrical contact to it. A thick silicide layer can be expensive to form.

Thus, in general, it would be desirable to form a conductive isolated area which can be manufactured at low cost and compatible with existing processes used to manufacture semiconductor devices.

SUMMARY OF THE INVENTION

A dielectric and conductive isolated island is fabricated by first providing an active wafer having a first surface and a second surface. A trench extending into the active wafer from the first surface to form an island is then formed. A first conductive layer is formed on the first surface of the active wafer and in the trench. A doped region is formed in the active wafer adjacent to all of the conductive layer. A planarizable layer comprised of a dielectric layer is formed on the first conductive layer and in the trench so that the trench is at least filled by the planarizable layer. A handle wafer having a first surface and a second surface is then provided. The handle wafer and the active wafer are bonded together so that the first surface of the handle wafer and the planarizable layer are joined. A portion of the second surface of the active wafer is then removed so that at least a portion of the planarizable layer is exposed to provide the island to be surrounded with the conductive layer and the dielectric layer of the planarizable layer. The doped region is diffused so that it is present at at least a portion of the second surface.

DETAILED DESCRIPTION OF THE DRAWINGS

Figure 1:
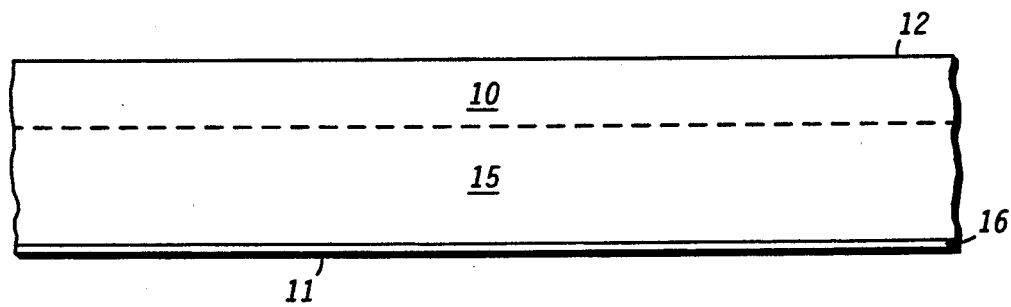
FIG. 1 illustrates an enlarged, cross-sectional view of a first embodiment of the present invention in a beginning stage of fabrication.

FIG. 1 illustrates an enlarged, cross-sectional view of a preferred, first embodiment of the present invention in a beginning stage of fabrication. The embodiments are not drawn to scale. As will be seen, dielectrically isolated islands will be fabricated having wrap around metal. An active wafer 10 is provided having a first major surface 11 and a second major surface 12. In a preferred embodiment, active wafer 10 is preferably of the first conductivity type, here an n-type silicon wafer. Active wafer 10 may be comprised of a substrate layer or a combination of a substrate layer at second major surface 12 and an epitaxial layer at first major surface 11. Other semiconductor material may be used, such as III-V materials. More preferably, a denuded zone 15 is formed in active wafer 10 extending into active wafer 10 from first major surface 11 a first distance. Denuded zone 15 is provided to form an isolated area that has a low amount of defects, without having to use an epitaxial layer. However, the formation of denuded zone 15 is not absolutely necessary. The first distance is chosen so that it is deeper than the desired island thickness. A denuded zone can be formed by any of the techniques known in the art.

A doped region 16 is then formed in active wafer 10 so that doped region 16 extends from first major surface 11 a second distance which is shorter than the first distance. In a preferred embodiment, phosphorus and arsenic are co-ion implanted into active wafer 10 through first major surface 11 to create doped region 16. As will be seen, these dopants are chosen to provide the desired dopant topography in the island after wafer bonding. Due to the different diffusivities of these dopants, the phosphorus will provide for proper doping of the island and the arsenic will provide a good ohmic contact to a conductive layer 18 (shown in FIG. 4). It may be possible that phosphorus alone will be enough to provide ohmic contact to conductive layer 18. A screen oxide (not shown) may be formed on first major surface 11 before ion implantation. In this way, impurities from the ion implanter are trapped by the screen oxide. If a screen oxide is used, it is removed after the ion implantation step. It is important to note that doped region 16 is formed non-selectively, i.e., without the use of a masking layer. This simplifies the process and reduces the cost of manufacture.

Figure 2:
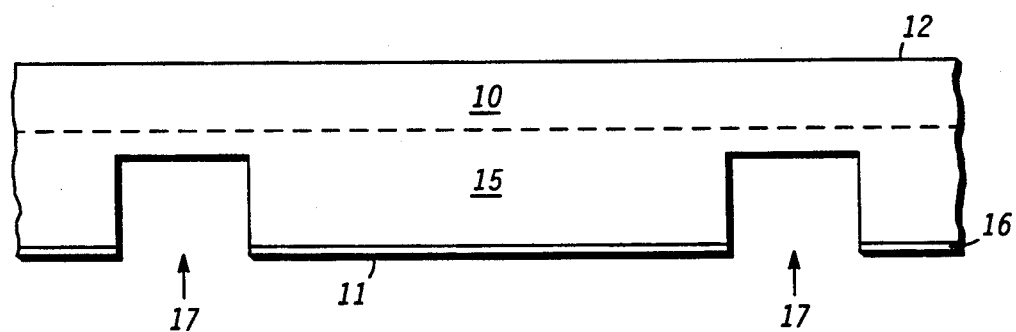
FIG. 2 illustrates an enlarged, cross-sectional view of the first embodiment of the present invention in a further stage of fabrication.

FIG. 2 illustrates the structure of FIG. 1 further along in processing. A channel or trench 17 is formed in active wafer 10 so that the trench extends from first major surface 11 a third distance which is shorter than the first distance but farther than the second distance. Preferably, the depth of trench 17 is also somewhat greater than the final island thickness desired. Trench 17 is shown to have a square bottom configuration, however, other configurations, such as a V-groove configuration may also be formed. One way to form trench 17 is by using well known photolithography and etch techniques to permit etching of active wafer 10 in the desired configuration. This is the only masking step required in the present invention to complete the formation of the island.

Figure 3:
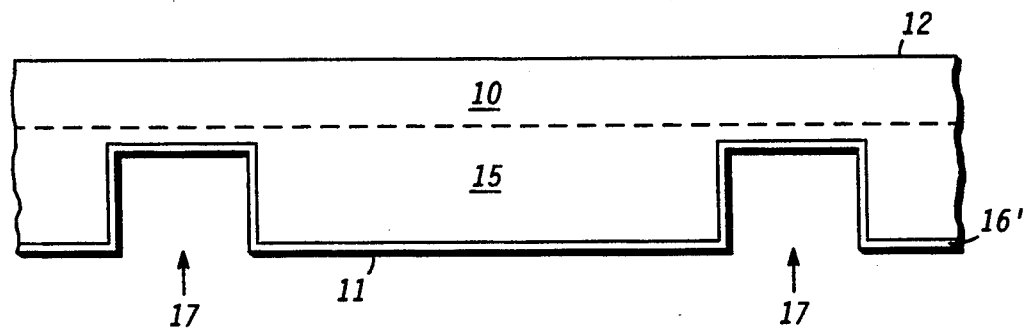
FIG. 3 illustrates an enlarged, cross-sectional view of a second embodiment of the present invention in an intermediate stage of fabrication.

FIG. 3 illustrates a second embodiment of the present invention in an intermediate stage of fabrication. This embodiment is fabricated similar to the first embodiment shown in FIGS. 1 and 2, except that a doped region 16' is formed after trenches 17 have been formed. It is also important to note that doped region 16' is formed without the use of a masking layer, like doped region 16.

Figure 4:
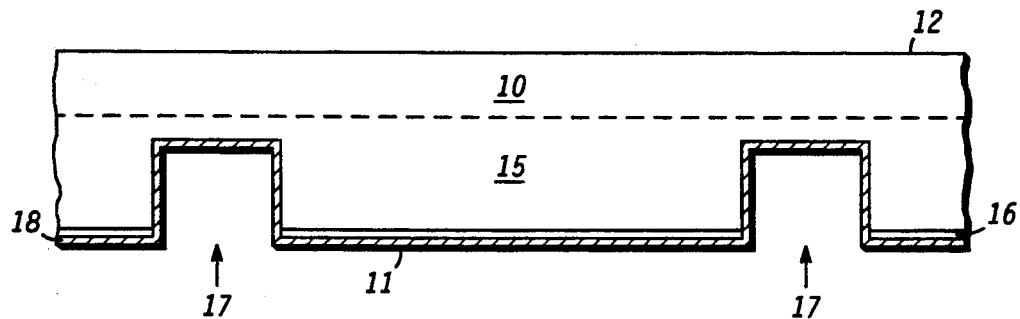
FIG. 4 illustrates an enlarged, cross-sectional view of the first embodiment of the present invention in a further stage of fabrication.

FIG. 4 illustrates the structure of FIG. 2 further along in processing. A conductive layer 18 is formed on first major surface 11 and in trench 17. Conductive layer 18 is comprised of a layer which is stable at the temperatures used to complete the formation of the island. In the first embodiment, conductive layer 18 is comprised of a layer through which and along which a dopant diffuses. At the present time, this includes a silicon rich conductive silicide. A silicon rich conductive silicide is such a layer. More preferably, conductive layer 18 is comprised of silicon rich tungsten silicide (silicon rich $WSi_2$ or $WSi_{2.6}$). Conductive layer 18 may be deposited by Low Pressure Chemical Vapor Deposition (LPCVD) to give a conformal coating on active wafer 10. In a preferred embodiment, it is desirable to have conductive layer 18 be as thick as possible to reduce series resistance; however, the thicker it is, the more expensive the processing will be. A reasonable thickness for conductive layer 18, as deposited, is in the range of 1000 to 4000 Angstroms.

Figure 5:
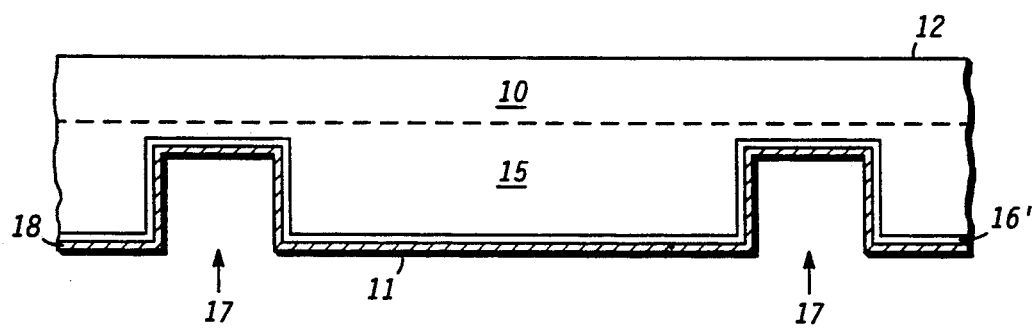
FIG. 5 illustrates an enlarged, cross-sectional view of the first or the second embodiments of the present invention in a further stage of fabrication.

FIG. 5 illustrates the structure of FIG. 3 further along in processing. In this embodiment, conductive layer 18 does not have to be a layer through which and along which a dopant diffuses. At the present time, this embodiment can also include conductive layer 18 comprised of titanium nitride. A titanium nitride layer can be formed by methods well known in the art.

Figure 6:
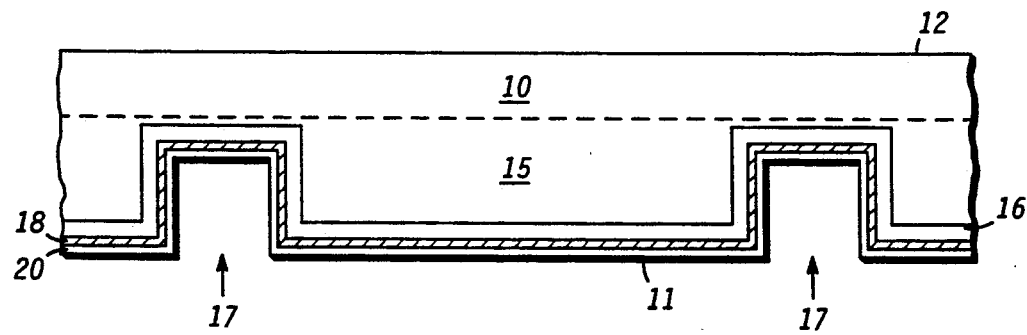
FIG. 6 illustrates an enlarged, cross-sectional view of the first or the second embodiments of the present invention in a further stage of fabrication.

FIG. 6 illustrates the structure of FIG. 4 or FIG. 5 further along in processing. A heating cycle is carried out. In this heating step, in the preferred, first embodiment, the excess silicon in the silicon rich conductive silicide of conductive layer 18 diffuses to the originally exposed surface so that the silicon rich conductive silicide densifies and converts to a conductive silicide. At this point, the conductive silicide has a thickness of approximately 750 to 3000 Angstroms. The silicon which diffuses out of the silicon rich conductive silicide oxidizes to form a dielectric layer 20, here a silicon dioxide layer on conductive silicide (conductive layer 18) when the heating cycle is performed in an oxidizing atmosphere. In the preferred embodiment that conductive silicide would be comprised of $WSi_2$.

This process step is preferably carried out at a temperature of approximately 1000° to 1050° C. for approximately 5 to 60 minutes, in an ambient comprised of oxygen to form a dielectric layer 20 having a thickness of 400 to 800 Angstroms. During this heating cycle, the dopant from doped region 16 will diffuse into and along conductive silicide layer 18, and thus diffuse the same from all parts of conductive layer 18 into denuded zone 15 of active wafer 10 because of the rapid diffusion of the dopant from doped region 16 down conductive layer 18, which quickly equalizes the concentration of the dopant from doped region 16 all along conductive layer 18. Active wafer 10 must be exposed to a temperature high enough somewhere in the process so that dopant from dopant region 16 migrates and equalizes along conductive layer 18. This is important because semiconductor devices will be built in doped region 16 or electrical contact will be made to doped region 16, as will be described below.

Figure 7:
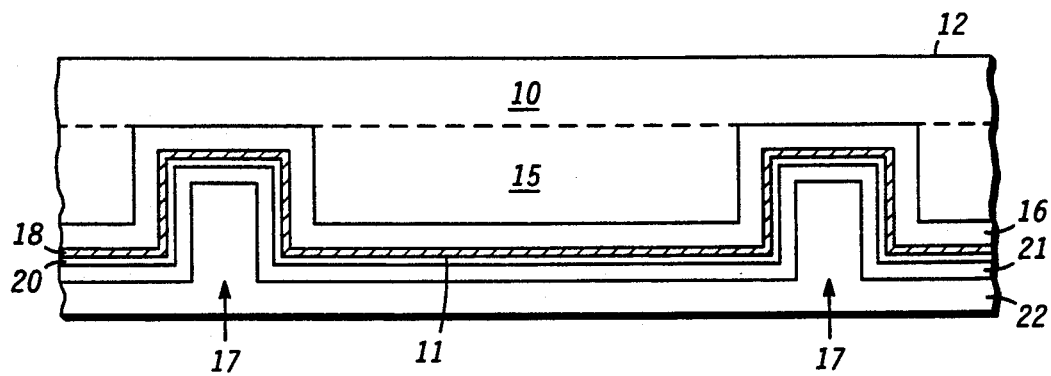
FIG. 7 illustrates an enlarged, cross-sectional view of the first or the second embodiments of the present invention in a further stage of fabrication.

In the second embodiment, doped region 16' also diffuses a little further, which is now shown as doped region 16 for convenience. A dielectric layer 20 would be formed on the surface of conductive layer 18. FIG. 7 illustrates the structure of FIG. 6 further along in processing. A dielectric layer 21 is formed on dielectric layer 20. Dielectric layer 21 is preferably a deposited glass layer having a thickness of approximately one micron. Dielectric layer 21 is formed to provide for better dielectric isolation, but is not absolutely necessary because dielectric layer 20 may be sufficient in some cases. Next, a planarizable layer 22 is formed on dielectric layer 21 so that trench 17 is at least filled, but preferably over filled. Planarizable layer 22 is planarized by, for example, polishing, reflowing, grinding, etchback, or a combination of those techniques. Planarizable layer 22 is preferably comprised of polysilicon, which may be planarized by polishing. Other planarizable materials may be used, such as dielectric materials such as silicon dioxide, silicon oxynitride ($SiO_xN_y$), or germanium silicon dioxide ($GeSiO_2$). Active wafer 10 is now ready for wafer bonding.

Figure 8:
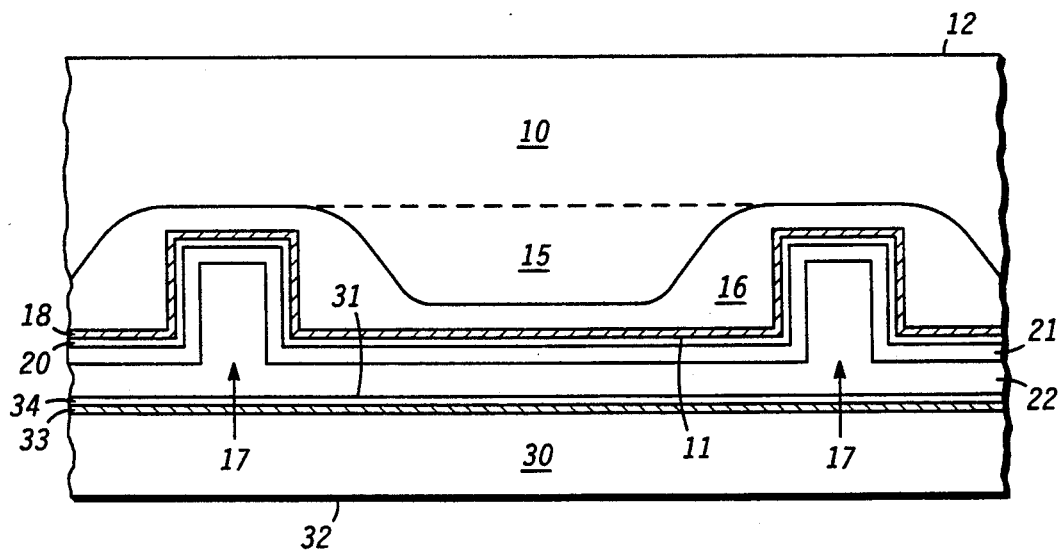
FIG. 8 illustrates an enlarged, cross-sectional view of the first or the second embodiments of the present invention in a further stage of fabrication.

FIG. 8 illustrates the structure of FIG. 7 further along in processing. A handle wafer 30 having a first major surface 31 and a second major surface 32 is provided. Handle wafer 30 is then bonded to active wafer 10 such that planarizable layer 22 and first major surface 31 are joined. Preferably, handle wafer 30 may simply be comprised of a bare polished surface 31, or may have a insulating layer on the polished surface 31 which is then joined and bonded to planarizable layer 22 of active wafer 10.

Another way the wafer bonding can be done is shown in FIG. 8. This wafer bonding step comprises providing handle wafer 30 to be comprised of a conductive layer 33 of about 750 to 3000 Angstroms on first major surface 31 of handle wafer 30, and an amorphous semiconductor layer 4 of approximately 1000 to 2000 Angstroms formed on conductive layer 33. Conductive layer 33 is comprised of the same material as conductive layer 18. Active wafer 10 and handle wafer 30 are then physically joined and heated so that a strong bond between them is formed.

The wafer bonding cycle, whether conductive layer 33 is formed or not, is preferably carried out at 1150° to 1250° C. for approximately 50 to 70 minutes in a steam ambient. In the embodiment shown in FIG. 8, the silicon rich metal silicide layer (conductive layer 33) dispels excess silicon so that the silicon rich conductive silicide layer converts to a conductive silicide layer during wafer bond. This excess silicon is quite mobile and helps form a void-free bond.

The long, high temperature wafer bond cycle diffuses the dopant region 16 farther into active wafer 10, as shown in FIG. 8. The ion implanted dopant of dopant region 16, as well as the wafer bond cycle to some extent, are chosen to give the desired dopant profile 16 in active wafer 10 after the wafer bond cycle. FIG. 8 illustrates the case where dopant region 16 is diffused so that it does not completely diffuse into the region between trench 17. It may be desirable to diffuse dopant region 16 to completely dope region 15 between the sides of trench 17.

Figure 9:
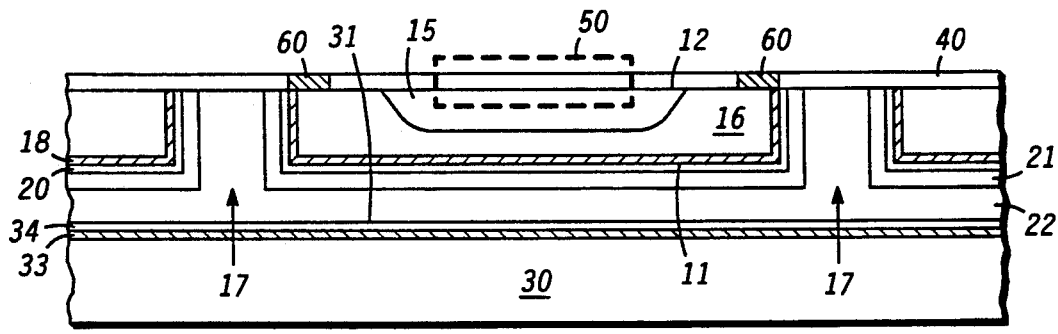
FIG. 9 illustrates an enlarged, cross-sectional view of the first or the second embodiments of the present invention in a further stage of fabrication.

FIG. 9 illustrates the structure of FIG. 8 further along in processing. A portion of active wafer 10 is removed from second major surface 12 until at least silicon dioxide layer 20 is exposed and to give islands of dopant region 16 of the desired thickness. This removal can be accomplished by grinding and polishing of second major surface 12. During removal of a portion of active wafer 10, the bottom of trench 17 becomes visible first, assisting in accurate shaping for island (tub) depth and uniformity. This is important because dopant density in the island or dopant region 16 is graded. Exposed edges of conductive layer 18 must be protected from oxidation during subsequent wafer processing, such as by forming a deposited dielectric layer 40 to prevent decomposition of conductive layer 18. Next, semiconductor devices, as shown by box 50, are fabricated in the island or denuded region 15.

Because the ion implanted dopant of doped region 16 is either equalized along conductive layer 18 or is implanted after trench 17 has been formed, dopant region 16 is present at at least a portion of second major surface 12. This facilitates making electrical contact to conductive layer 18 because metallization layer 60 can be formed to make electrical contact to doped region 16 only, close to, but not necessarily touching, conductive layer 18. However, metallization layer 60 can be formed to make physical contact with conductive layer 18 as shown in FIG. 9.

As can be readily seen, an island of doped region 16 is dielectrically isolated and has conductive layer 18 which wraps totally around the dielectric isolation. The wrap around conductive layer 18 is formed with only one masking step (to form trench 17), thus making it a low cost process. The wrap around conductive layer 18 reduces the electrical resistance of the devices 50, e.g. DMOS devices, fabricated in denuded region 15. The resistivity of doped region 16 can be controlled, high voltages devices can be formed without the need to have active wafer 10 be comprised of a substrate and an epitaxial layer.

We claim:

1. A method of forming a dielectric and conductive isolated island, comprising the steps of:
   providing a semiconductor wafer having a first surface and a second surface;
   forming a doped region extending into the semiconductor wafer from the first surface;
   forming a trench extending into the semiconductor wafer from the first surface farther than the doped region to form an island;
   forming a first conductive layer on the first surface of the semiconductor wafer and in the trench;
   forming a planarizable layer comprised of a dielectric layer on the first conductive layer and in the trench so that the trench is at least filled by the planarizable layer;
   planarizing the planarizable layer;
   providing a handle wafer having a first surface and a second surface;
   bonding the handle wafer and the semiconductor wafer together so that the first surface of the handle wafer and the planarizable layer are joined;
   diffusing the doped region farther into the semiconductor wafer; and
   removing a portion of the second surface of the semiconductor wafer so that at least a portion of the planarizable layer is exposed to provide the island of the semiconductor wafer surrounded by the conductive layer and the dielectric layer of the planarizable layer, wherein the doped region is present at at least a portion of the second surface.

2. The method of claim 1 wherein the step of forming the first conductive layer comprises forming a silicon rich conductive silicide layer.

3. The method of claim 1 further wherein the step of forming the first conductive layer comprises forming a first silicon rich tungsten silicide.

4. The method of claim 1 further wherein the step of forming the doped region comprises co-ion implanting arsenic and phosphorus into the semiconductor wafer.

5. The method of claim 1 further wherein the step of forming the first conductive layer comprises forming a titanium nitride.

6. The method of claim 1 wherein the step of providing the handle wafer comprises providing the handle wafer having a second conductive layer on the first surface and an amorphous semiconductor layer on the second conductive layer.

7. The method of claim 1 wherein the step of bonding the semiconductor wafer to the handle wafer comprises heating the semiconductor wafer and the handle wafer at a temperature of approximately 1150°–1250° C. for approximately 50–70 minutes in steam.

8. The method of claim 1 wherein the step of providing the semiconductor wafer comprises providing the semiconductor wafer having a denuded zone extending into the semiconductor wafer from the first surface farther than the trench.

9. The method of claim 2 wherein the step of forming the planarizable layer comprises the steps of:
   forming the dielectric layer of the planarizable layer on the silicon rich conductive silicide layer by heating the semiconductor wafer such that silicon diffuses out of the silicon rich conductive silicide layer, thus converting the silicon rich conductive layer to a conductive silicide layer; and
   forming a planarizable portion of the planarizable layer on the dielectric layer.

10. A method of forming a dielectric and conductive isolated island, comprising the steps of:
   providing an semiconductor wafer having a first surface and a second surface;
   forming a doped region extending into the semiconductor wafer from the fist surface by introducing a dopant into the semiconductor wafer;
   forming a trench extending into the semiconductor wafer from the first surface farther than the doped region to form an island;
   forming a first silicon rich conductive silicide layer on the first surface of the semiconductor wafer and in the trench;

converting the first silicon rich conductive silicide layer to a first conductive silicide layer so that a dielectric layer is formed on the first conductive silicide layer;

forming a planarizable layer on the dielectric layer and in the trench so that the trench is at least filled by the planarizable layer;

planarizing the planarizable layer;

providing a handle wafer having a first surface and a second surface;

bonding the handle wafer and the semiconductor wafer together so that the first surface of the handle wafer and the planarizable layer are joined;

diffusing the doped region so that the dopant from the doped region diffuses along the conductive silicide layer to form an equalized concentration of dopant along the conductive silicide layer which diffuses into the semiconductor wafer to form the doped region adjacent all of the conductive silicide layer; and removing a portion of the second surface of the semiconductor wafer so that at least a portion of the planarizable layer is exposed to provide the island of the semiconductor wafer surrounded by the conductive layer and the dielectric layer of the planarizable layer, wherein the doped region is present at at least a portion of the second surface.

11. The method of claim 10 further wherein the step of forming the first silicon rich conductive silicide layer comprises forming a first silicon rich tungsten silicide.

12. The method of claim 10 further wherein the step of forming the doped region comprises co-ion implanting arsenic and phosphorus into the semiconductor wafer.

13. The method of claim 10 wherein the step of providing the handle wafer comprises providing the handle wafer having a second silicon rich conductive silicide layer on the first surface and an amorphous semiconductor layer on the second silicon rich conductive silicide layer.

14. The method of claim 13 wherein the step of bonding the semiconductor wafer and the handle wafer comprises the silicon rich conductive silicide layer expelling excess silicon to convert the silicon rich conductive silicide layer to a conductive silicide layer, wherein the excess silicon diffuses to form a void-free bond between the semiconductor wafer and the handle wafer.

15. The method of claim 10 wherein the step of bonding the semiconductor wafer to the handle wafer comprises heating the semiconductor wafer and the handle wafer at a temperature of approximately 1150°–1250° C. for approximately 50–70 minutes in steam.

16. The method of claim 10 wherein the step of providing the semiconductor wafer comprises providing the semiconductor wafer having a denuded zone extending into the semiconductor wafer from the first surface farther than the trench.

17. The method of claim 10 wherein the doped region extends at least from the first surface of the semiconductor wafer to the bottom of the trench.

18. A method of forming a dielectric and conductive isolated island, comprising the steps of:

providing a semiconductor wafer having a first surface and a second surface;

forming a trench extending into the semiconductor wafer from the first surface, wherein the trench has a bottom;

forming a doped region after the step of forming the trench, wherein the doped region extends into the semiconductor wafer from the first surface shallower than the bottom of the trench and extends into the semiconductor wafer from the trench;

forming a first conductive layer on the first surface of the semiconductor wafer and in the trench;

forming a planarizable layer comprised of a dielectric layer on the first conductive layer and in the trench so that the trench is at least filled by the planarizable layer;

planarizing the planarizable layer;

providing a handle wafer having a first surface and a second surface;

bonding the handle wafer and the semiconductor wafer together so that the first surface of the handle wafer and the planarizable layer are joined;

diffusing the doped region farther into the semiconductor wafer; and removing a portion of the second surface of the semiconductor wafer so that at least a portion of the planarizable layer is exposed to provide the island of the semiconductor wafer surrounded by the conductive layer and the dielectric layer of the planarizable layer, wherein the doped region is present at at least a portion of the second surface.

* * * * *

UNITED STATES PATENT AND TRADEMARK OFFICE
CERTIFICATE OF CORRECTION

PATENT NO. : 5,268,326
DATED : December 7, 1993
INVENTOR(S) : Isreal A. Lesk, et. al.

It is certified that error appears in the above-indentified patent and that said Letters Patent is hereby corrected as shown below:

Column 6, line 53, before layer, insert --silicide--. (first occurrence)

Column 6, line 61, "fist" should read --first--.

Signed and Sealed this

Eleventh Day of October, 1994

Attest:

BRUCE LEHMAN

*Attesting Officer*   *Commissioner of Patents and Trademarks*